United States Patent
St. Louis et al.

(10) Patent No.: US 6,839,235 B2
(45) Date of Patent: Jan. 4, 2005

(54) EMBEDDED HEAT PIPE FOR A CONDUCTION COOLED CIRCUIT CARD ASSEMBLY

(75) Inventors: Chad St. Louis, Nepean (CA); David Perry, Kinburn (CA); Ivan Straznicky, Carleton Place (CA)

(73) Assignee: Dy 4 Systems Inc., Ontario (CA)

( * ) Notice: Subject to any disclaimer, the term of this patent is extended or adjusted under 35 U.S.C. 154(b) by 110 days.

(21) Appl. No.: 10/325,631

(22) Filed: Dec. 19, 2002

(65) Prior Publication Data

US 2004/0120116 A1 Jun. 24, 2004

(51) Int. Cl.[7] .................................................. H05K 7/20
(52) U.S. Cl. ................ 361/700; 165/106.33; 165/80.2; 174/15.2; 361/704; 361/719; 361/720
(58) Field of Search .................................. 62/3.2, 259.2; 174/15.2; 165/80.2, 80.4, 104.33; 361/687, 698–699, 702–710, 719–721, 724–727, 752–759, 796–802; 454/184

(56) References Cited

U.S. PATENT DOCUMENTS

| | | | | |
|---|---|---|---|---|
| 4,330,812 A | * | 5/1982 | Token | 361/720 |
| 4,916,575 A | * | 4/1990 | Van Asten | 361/715 |
| 4,994,937 A | * | 2/1991 | Morrison | 361/715 |
| 5,999,407 A | * | 12/1999 | Meschter et al. | 361/704 |
| 6,246,582 B1 | * | 6/2001 | Habing et al. | 361/704 |
| 6,392,891 B1 | * | 5/2002 | Tzlil et al. | 361/719 |

* cited by examiner

Primary Examiner—Gregory D Thompson
(74) Attorney, Agent, or Firm—Zito tlp; Joseph J. Zito; Kendal M. Sheets

(57) ABSTRACT

One or more heat pipes are connected between a component on a circuit card and the frame of a circuit card assembly for transfer of heat to the frame of the circuit card assembly. Circuit cards are typically held in place in channels in a chassis by an expansion type retention device. The circuit cards also include a heat frame for collecting the heat produced by the card components and channeling the heat from the card through the heat frame to the chassis. The retention device presses the heat frame in to thermal contact with one side of the channel. Heat collector can be attached to the heat generating components of a circuit card between the heat pipe and the component to provide improved thermal transfer. A number of heat collectors with pairs of heat pipes extending in opposite directions from the collector to the frame can be used to allow the heat pipes to effectively dissipate heat form the circuit card assembly regardless of the orientation of the circuit card assembly.

5 Claims, 5 Drawing Sheets

EMBEDDED HEAT PIPE FOR A CONDUCTION COOLED CIRCUIT CARD ASSEMBLY

BACKGROUND OF THE INVENTION

The present invention relates to the mounting of circuit card assemblies (CCA's) in a chassis or enclosure and to the maintenance of proper operating temperatures of mounted CCA's. More specifically, the present invention relates to heat transfer structures for removing operational heat from a circuit card through conduction of the heat to the surrounding chassis during operation.

It is common for CCA's to be mounted in a structure that is referred to as a chassis 13, FIG. 1. The chassis includes a number of parallel guide channels 14 for accommodating a number of CCA's 10. The individual cards 10 are slid into the chassis 13 along the channels 14 and electrically connected to the unit at the backplane. It is important in many applications to insure that each of the cards 10 are held in place in the channels 14 to ensure proper electrical connection, to improve heat conduction and to prevent damage to the cards which can arise from motion. Movement of the card can cause connections to the card to be broken resulting in card and/or system failure. A common method of securing circuit cards in place is to use a retaining device 15 which expands to create a tight fit within the channel 14, such as a wedge lock which is expanded once the card 10 is positioned in a channel 14 to wedge the card in place against the walls of the channel.

The use of multiple circuit cards and high-power or densely packed components can often result in the production of heat which cannot be easily dissipated. Excess heat will create temperatures above a normal or acceptable operating temperature range with the potential for improper operation, card failure or system failure. The individual components on a circuit card produce heat that must be conveyed away from the components and from the circuit card so that the temperatures of the components does not exceed their maximum operating temperature. Because of the amount of heat generated by the components, and the closely spaced circuit cards and limitations on the chassis, which may include sealing the chassis due to harsh environmental conditions, such as military and/or aerospace applications, the heat must be removed by conduction. As the sizes of the components become smaller and the spacing becomes tighter, the power dissipation per area increases and the heat removal problem becomes greater.

Heat can be conducted away from the individual components along the plane of the printed circuit card. As illustrated in FIG. 2, a printed circuit card 10 can include metal strips 11 along one or more edges of the card which make contact with a heat transfer frame 12 attached to the card to conduct heat from the circuit card to the chassis 13. CCA's designed for use in high-temperature environments often also incorporate heat dissipation channels in the circuit card to conduct heat away from individual components along the plane of the card to the heat dissipation strips 11 along the edge of the circuit card. These heat conducting strips 11, often metal pads, are located on an outer surface of the card 10 and are in contact with a heat dissipation frame 12, FIG. 3, which contacts one side of the parallel channel 14 of the chassis 13 when the card is mounted in the chassis channel 14 and held in place with a wedge lock device 15. As illustrated in FIG. 4, the heat dissipation frame is located on the side opposite from the wedge lock device 15 so that the frame is in direct contact with the wall of the channel 14 in the chassis 13.

The heat dissipation frame 12 may be an open frame which contacts the edge of the card or can include planer elements 18 which may be shaped to come in contact with one or more components 19 on the card 13 to directly conduct heat away from the components 19 to the frame 12. A portion of the frame is positioned in contact with the chassis 13 so as to conduct heat from the frame 12 to the chassis. The contact between the frame and the chassis is maintained by the wedge lock device 15. However, the frame is only in contact with one side of the channel, thereby limiting the conductive channel for the removal of heat.

As illustrated in FIGS. 4A through 4D, although the wedge lock 15 is in contact with the heat dissipation frame 12 and the chassis 13, it is a poor conductor of heat because the bottom segments 16 and top segments 17 of the wedge lock are not in good thermal contact with each other. FIGS. 4A and 4B illustrate the wedge lock before expansion. Bottom segments 16 are connected to the card and but can slide laterally when the wedge lock is expanded as illustrated in FIGS. 4C and 4D. Bottom segment 1 6a is attached to the card 10 and does not move laterally. When the wedge lock 15 is expanded to secure the card 10 in position, the top segments 17 are pushed up away from the bottom segments 16 and also move laterally. The resulting spacing between segments and the spacing between upper segments 17 and the card 10, results in a loss of thermal conductivity. The bottom 16 of the wedge lock contacts the heat frame 12 but the top of the wedge lock does not conduct heat well to the opposite side of the channel of the chassis 13. As illustrated in FIG. 4B, the wedge lock 15 has a hollow interior 9 to accommodate the central spindle 8 of the wedge lock. The hollow interior 9 of the wedge lock 15 also reduces thermal conductivity.

SUMMARY OF THE INVENTION

The purpose of the invention is to provide a low resistance heat transfer path for a high powered device or devices to an area where the heat can e dispersed efficiently and effectively. The present invention improves the conduction of heat by the inclusion of heat pipes embedded within the design of a conduction cooled circuit card assembly (CCA). The heat pipes used are sealed pipes that contain a wick structure and working fluid that uses latent heat of vaporization to move heat from one area of the pipe to another. By the process of evaporation and condensation of a fluid, heat pipes have proven to be an effective carrier of heat energy, As such, heat form high powered components can be transferred efficiently and effectively to a heat sink of cold plate for dissipation. This provides for reduced junction operating temperatures on given components and increases the reliability of circuit card assemblies operating in harsh environment applications. The present invention may be applied to CCA's that may or may not include mezzanine cards mounted onto the host CCA.

The circuit card assembly of the present invention, as illustrated in FIGS. 4 and 5, includes a printed circuit card 10 which has edge connector 6 and heat generating components 19, such as micro processors, mounted to the card 10. A standard frame structure 12 surrounds the card 10 to make a typical CCA. The frame will act as a thermal path from the board 10 to the chassis 13, as described above. The frame 12 will include a thermal interface such as frame edge 7 for contact with the chassis 13 to transfer heat. The frame is clamped in place by a typical expanding locking mechanism for clamping the card edge and frame edge 7 to the cold wall of the chassis 13. The frame can also include planer elements 18 which may be shaped to come in contact with one or more components on the card 10 to directly conduct heat away from the components 19 to the frame 12. The frame may also include a secondary thermal interface shunt such as heat dissipation plate 21 illustrated in FIG. 6 and described in co-pending patent application Ser. No. 10/208,272. The present invention adds the heat collectors 26 and the heat pipes 27 for enhanced heat conduction from the CCA to the frame 12 and then to the chassis 13.

Implementation of the heat pipes of the present, invention allows for the placement of high powered components 19 at any desired location on the card 10, including near or at the center of the card. Peripheral components can then be located nearby on the PCB thus improving signal integrity and in some instances, reducing electromagnetic radiation.

BRIEF DESCRIPTION OF THE DRAWINGS

For a better understanding of the nature of the present invention, reference is had to the following figures and detailed description, wherein like elements are accorded like reference numerals, and wherein.

DETAILED DESCRIPTION OF PREFERRED EXEMPLARY EMBODIMENTS

Figure 1:
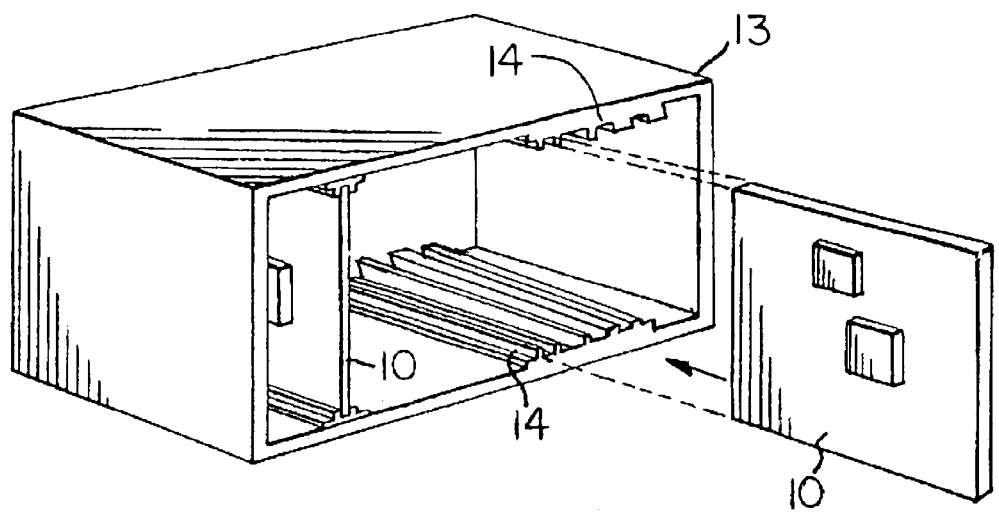
FIG. 1 is a perspective view of a chassis with channels to accommodate cards.
Figure 2:
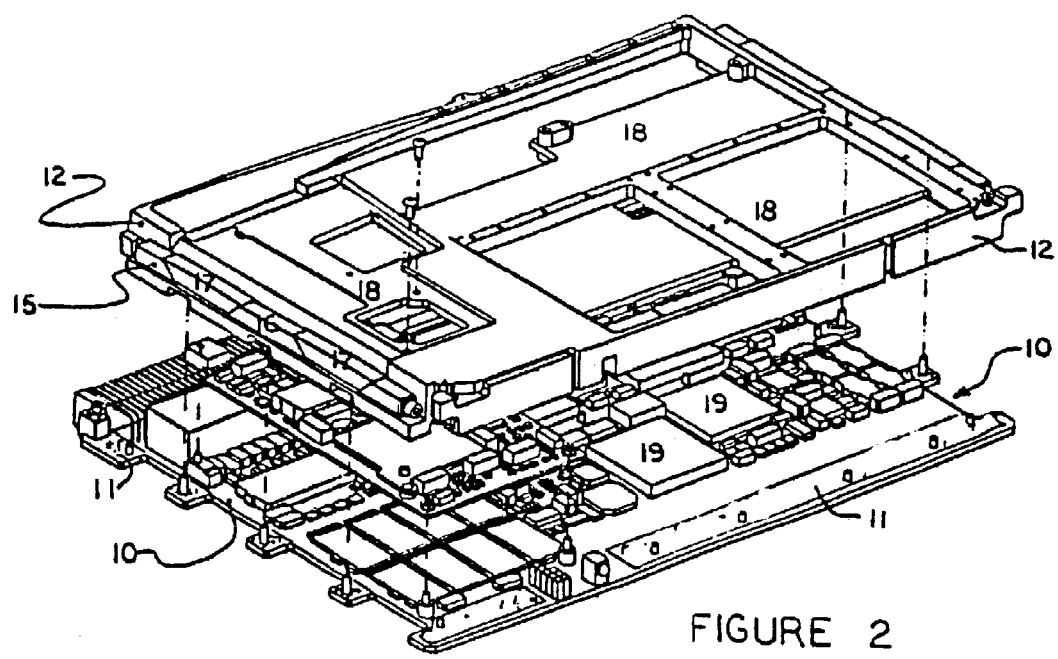
FIG. 2 is a top perspective view of a prior art circuit card and heat dissipation frame.
Figure 3:
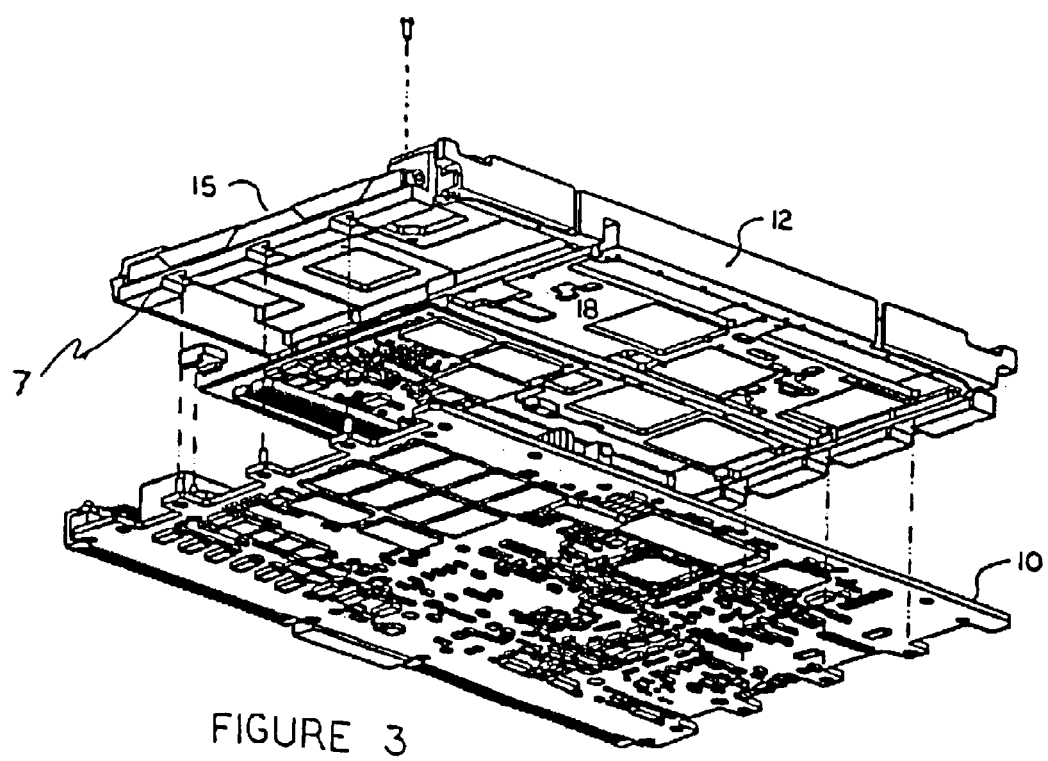
FIG. 3 is a bottom perspective view of a prior art circuit card and heat dissipation frame.
Figure 4:
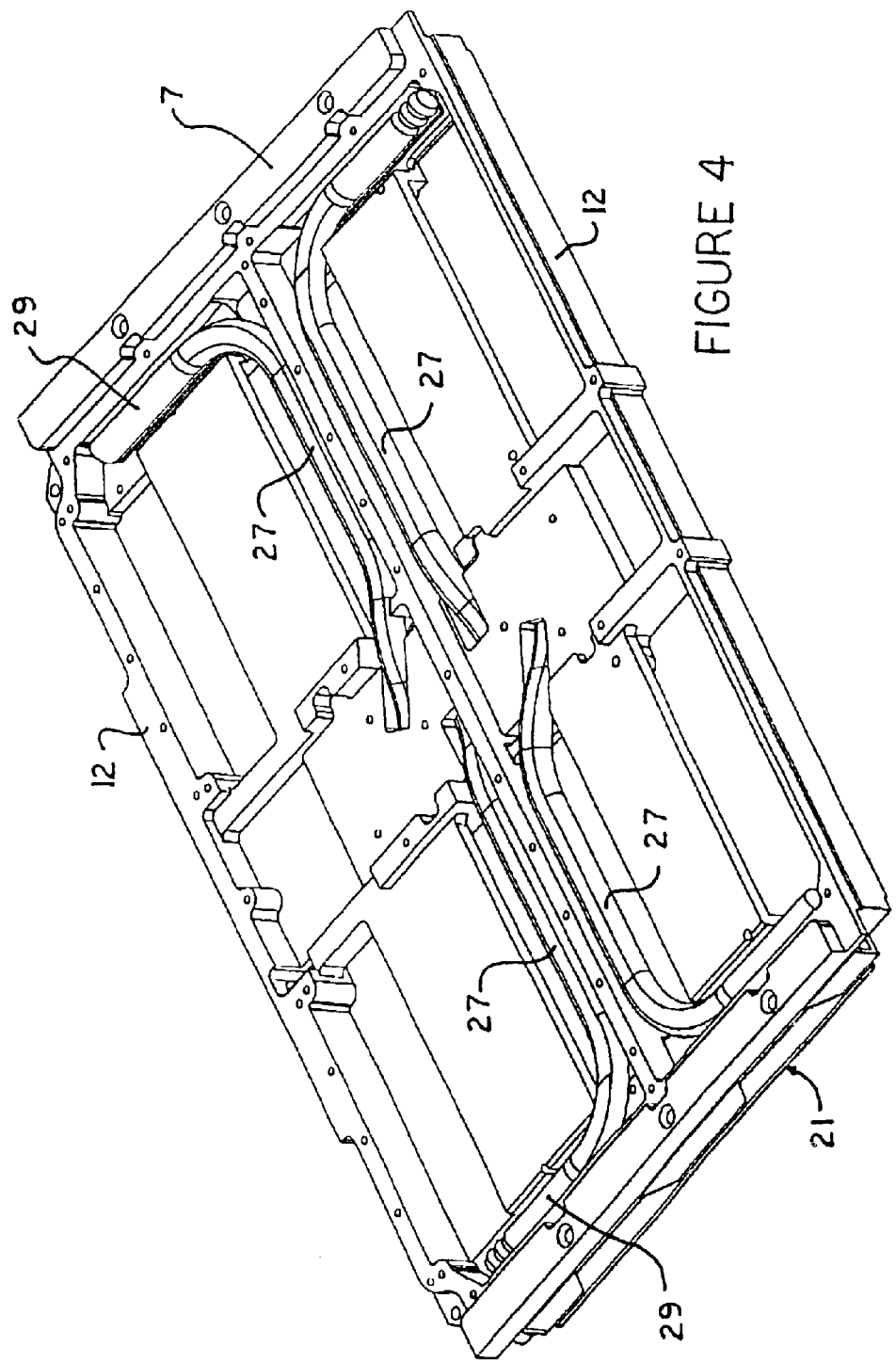
FIG. 4 is a bottom perspective view of a frame and heat pipe assembly with the circuit card removed to better illustrate the heat pipes of the present invention.
Figure 5:
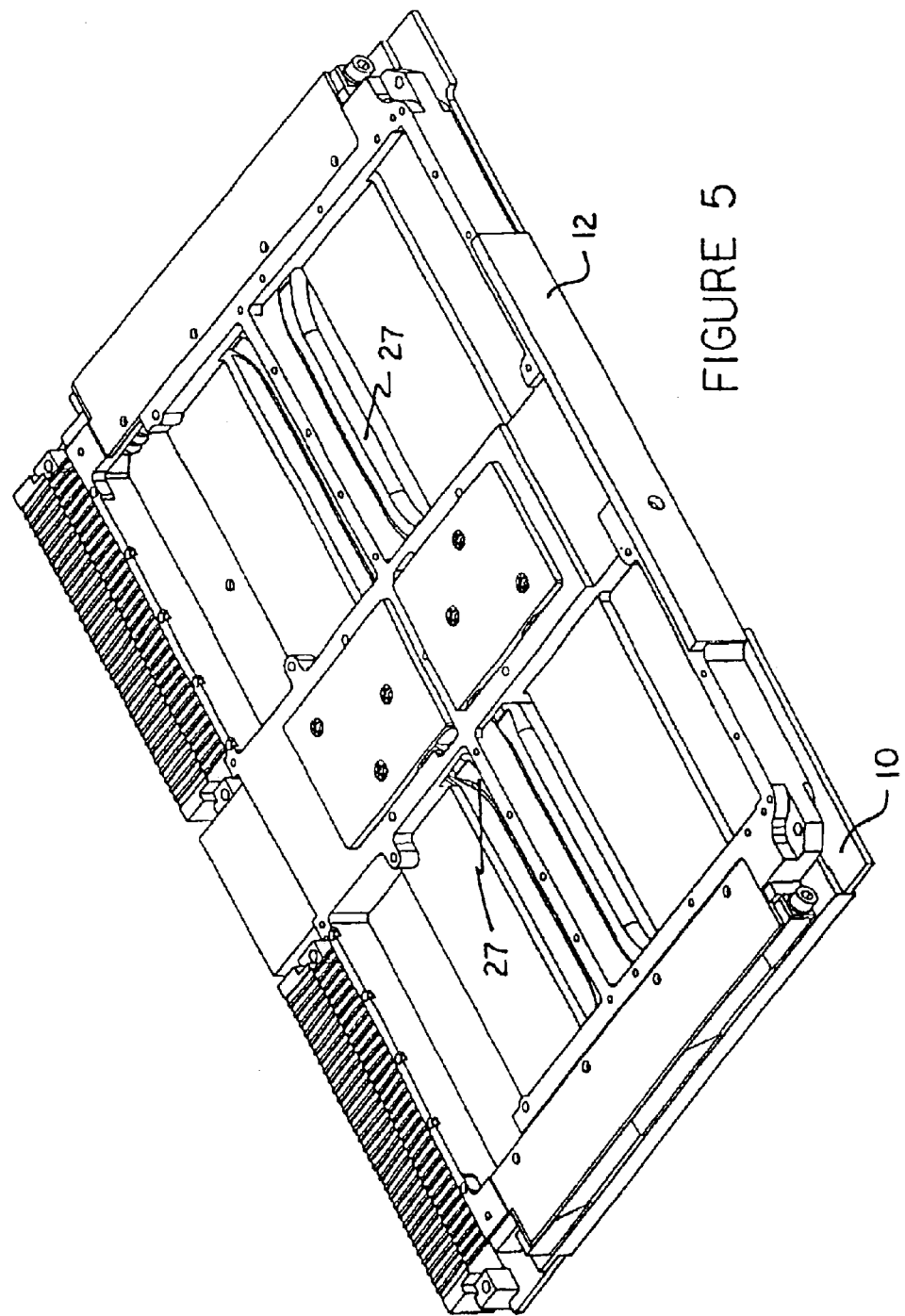
FIG. 5 is a top perspective view of a frame and heat pipe assemble of the present invention illustrating the frame in contact with a card to make a CCA prior to insertion into a chassis.
Figure 6:
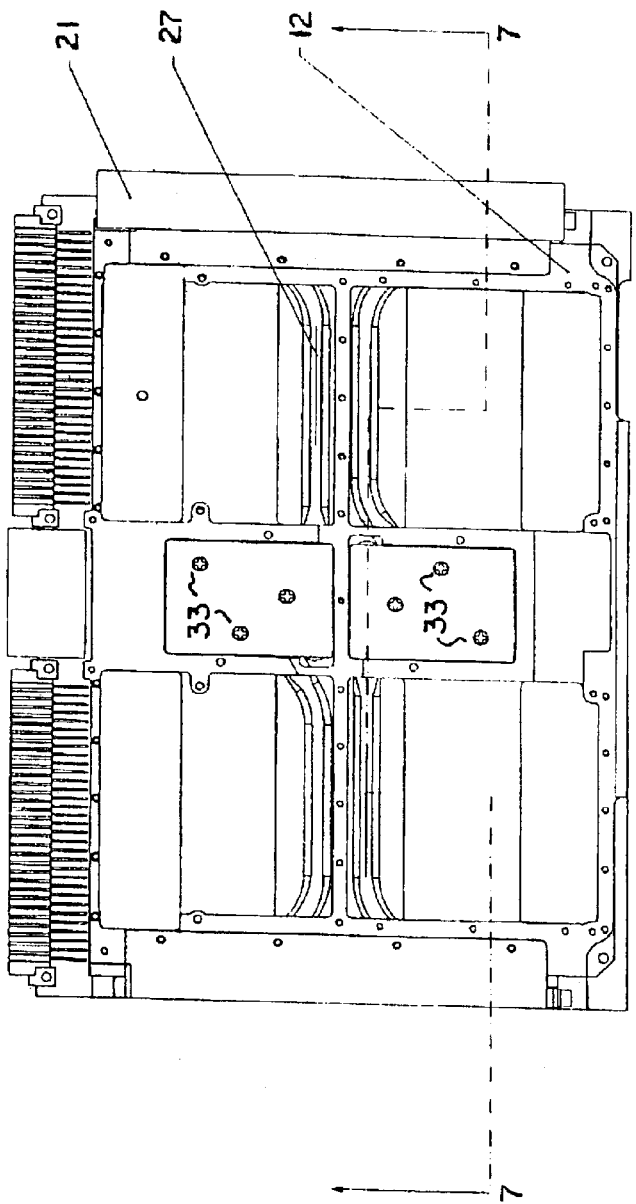
FIG. 6 is a top plane view of a frame and heat pipe assembly of the present invention.
Figure 7:
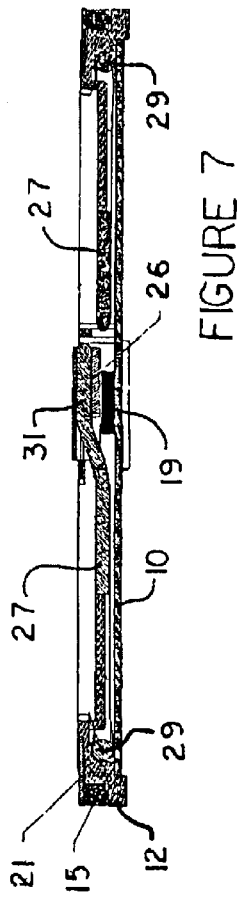
FIG. 7 is a cross sectional view of a frame and heat pipe assembly of the present invention taken along line 7—7 of FIG. 6.

The condenser portion of the heat pipe 29, the area of condensation inside the pipe, is attached to the frame structure along the card edge. A bonding agent, such as tin-lead solder or another thermally conductive adhesive, is used to adjoin the two components, the heat tube condensation end 29 and the end of the frame 12. The opposite end of the heat pipe, the evaporator portion 31 (area of evaporation inside the pipe), is embedded within a heat spreader 26 also referred to as the collector 26. Elements 26 and 31 are better illustrated in FIG. 7.

The collector 26 can also house a second heat pipe 27 that extends to the opposite edge of the frame 12. A redundant configuration, two heat pipes extending in opposite directions, as illustrated in the preferred embodiment herein, provides proper operation in all orientations of the CCA. Because the CCA are often used in demanding environments under challenging conditions, the orientation of a card at will not remain constant. Therefore, proper and effective operation regardless of orientation is an important factor of the present invention. A bonding agent is also used to connect the two heat pipe ends 31 to the collector 26. The collector 26 itself is not fixed directly to the frame 12. The collector 26 is suspended by the length of the two heat pipes 27. By suspension in this manner, the collector 26 the elastic bending property of the heat pipes 27 will allow for tolerance variations in component 19 height.

The vertical placement of the collector 26 and therefore its thermal contact with component 19, is determined by adjustment screws 33 in the frame structure. The lower end of the screws 33 press on tabs on the collector 26 and rotation of the screws 33 adjusts the vertical placement of the collector 26. Therefore, the torque setting of the screws 33 may be used to control the thermal interface compression between the collector 26 and the component 19.

The span of the heat pipes that extends form the collector 26 to each card/frame edge, conforms to keep out areas as defined by IEEE 1101.2 and IEEE 1386.1. In embodiments where a large diameter heat pipe 27 is used, the pipe may be bent or partially flattened in order to comply with the IEEE specifications.

Because many varying and different embodiments may be made within the scope of the inventive concept herein taught, and because many modifications may be made in the embodiments herein detailed in accordance with the descriptive requirements of the law, it is to be understood that the details herein are to be interpreted as illustrative and not in a limiting sense.

We claim:

1. An apparatus for improving the conduction of heat from a circuit card having a heat dissipation frame and an expansion type retaining device for mounting said circuit card in a channel of a chassis, comprising:

a heat collector in thermal contact with at least a first component on said circuit card, and a first heat pipe in thermal contact with said heat collector and extending from said heat collector to a first edge of said heat dissipation frame.

2. The apparatus of claim 1, further comprising:

a second heat pipe in thermal contact with said heat collector and extending from said heat collector to a second edge of said heat dissipation frame opposite said first edge of said heat dissipation frame.

3. The apparatus of claim 2, wherein:

each of said first and second heat pipes has a condensation portion and an evaporation portion; and said condensation portion of each of said heat pipes is in thermal contact with said heat dissipation frame; and said evaporation portion of each of said heat pipes is in thermal contact with said heat collector.

4. The apparatus of claim 1, further comprising:

a set of adjustment screws for maintaining proper thermal contact between said first heat pipe and said heat collector.

5. The heat apparatus of claim 1, further comprising:

a second heat collector in thermal contact with at least a second component on said circuit card;

a third heat pipe in thermal contact with said second heat collector and extending from said second heat collector to said first edge of said heat dissipation frame; and a fourth heat pipe in thermal contact with said second heat collector and extending from said second heat collector to said second edge of said heat dissipation frame opposite said first edge of said heat dissipation frame.

* * * * *